United States Patent [19]
Kiriaki

[11] Patent Number: 5,606,530
[45] Date of Patent: Feb. 25, 1997

[54] HIGH SPEED ROM DECODE CIRCUIT

[75] Inventor: Sami Kiriaki, Garland, Tex.

[73] Assignee: Texas Instruments Incorporated, Dallas, Tex.

[21] Appl. No.: 616,235

[22] Filed: Mar. 13, 1996

Related U.S. Application Data

[63] Continuation of Ser. No. 346,716, Nov. 30, 1994, abandoned.

[51] Int. Cl.$^6$ .................................................... G11C 8/00
[52] U.S. Cl. ....................... 365/230.06; 365/185.23; 326/105; 326/106
[58] Field of Search ............... 365/230.06, 185.23; 327/312, 374, 376, 389, 391, 579; 326/105, 106

[56] References Cited

U.S. PATENT DOCUMENTS

| | | | |
|---|---|---|---|
| 4,899,315 | 2/1990 | Houston | 365/230.06 |
| 5,347,486 | 9/1994 | Urai | 365/230.06 X |
| 5,490,119 | 2/1995 | Sakurai et al. | 365/230.08 |

FOREIGN PATENT DOCUMENTS

| | | | |
|---|---|---|---|
| 60-61996 | 4/1985 | Japan | 365/230.06 |

OTHER PUBLICATIONS

IBM Technical Disclosure Bulletin, "Two–Stage Decoder for Static RAMs", vol. 29, No. 5, Oct. 1986, pp. 2306–2307.

*Primary Examiner*—Son T. Dinh
*Attorney, Agent, or Firm*—W. Daniel Swayze, Jr.; W. James Brady, III; Richard L. Donaldson

[57] ABSTRACT

A decode circuit which permits large address decoding (corresponding to an increase in the number of ROM words) and/or an increase in the number of bits per word line while preserving ROM speed. This is accomplished by providing a positive feedback arrangement at the decode circuit output to speed up the increase in voltage at the decode circuit output during the pulldown phase of the clock cycle. As the voltage at an output line of the decode circuit is increasing through a first p-channel transistor coupled to a voltage supply, a second n-channel transistor having its gate coupled to the decode circuit output line is turned on and thereby applies a ground potential to the gate of the first transistor. This ground potential causes the first transistor to conduct even more rapidly and thereby increase the voltage at the decode circuit output more rapidly. This, in turn, causes the second transistor to apply ground potential to the gate of the first transistor even more rapidly. The result is that the output of the decode circuit is raised to approximately the supply voltage during the pulldown portion of the clock cycle much more rapidly than in prior art decode circuits that do not use the positive feedback arrangement of the present invention. The result is that prior art circuits can be made to operate with greater speed or can be provided with additional word lines and/or bit lines without decrease in speed.

12 Claims, 2 Drawing Sheets

HIGH SPEED ROM DECODE CIRCUIT

This application is a continuation of application Ser. No. 08/346,716 filed on Nov. 30, 1994.

BACKGROUND OF THE INVENTION

FIELD OF THE INVENTION

This invention relates to read only memory (ROM) circuits and, more specifically, to a high speed decode circuit for use in such ROM circuits.

BRIEF DESCRIPTION OF THE PRIOR ART

Read only memory (ROM) circuits are generally composed of memory elements disposed in rows or word lines and columns or bit lines. A particular word in memory is generally addressed by energizing the row or word line corresponding to the desired word while also energizing the columns of bit lines for all of the bits corresponding to the addressed word. A typical example of such a decode circuit is shown in U.S. Pat. No. 4,899,315 of Theodore W. Houston, assigned to the assignee of the subject application. As the size of the ROM increases (i.e., both the number of rows and/or the number of columns increases) due to the ability to provide semiconductor devices with an increasing number of transistors thereon, the speed degrades quickly and the ROM becomes inefficient. The speed degradation is mainly due to the use of inefficient decode circuitry. Innovations in decode circuits have improved ROM speed and therefore provide the ability to fabricate an ever improving ROM of greater component density with improved speed. However, the requirement for ROMs of continually greater size and component density which are operable at continually greater speeds continues. It is therefore apparent that any increase in ROM size and component density which can be accompanied by a correspondingly smaller decrease in efficiency and/or an increase in ROM speed with a correspondingly smaller decrease in ROM size is always being sought.

SUMMARY OF THE INVENTION

In accordance with the present invention, there is provided a novel decode circuit for a semiconductor memory, primarily for a ROM, which allows for large address decoding (corresponding to an increase in the number of ROM words) and/or an increase in the number of bits per word while preserving ROM speed. This is accomplished by providing a positive feedback arrangement at the decode circuit output to speed up the increase in voltage at the decode circuit output during the pulldown phase of the clock cycle.

Briefly, as the voltage at an output line of the decode circuit is increasing through a first p-channel transistor coupled to a voltage supply, a second n-channel transistor having its gate coupled to the decode circuit output line is turned on by the increase in voltage and thereby applies a ground potential to the gate of the first transistor. This ground potential causes the first transistor to conduct even more rapidly and thereby increase the voltage at the decode circuit output more rapidly. This, in turn, causes the second transistor to apply ground potential to the gate of the first transistor even more rapidly. The result of this positive feedback arrangement is that the output of the decode circuit is raised to approximately the supply voltage during the pulldown portion of the clock cycle much more rapidly than in prior art decode circuits that do not use the positive feedback arrangement of the present invention. In this manner, prior art circuits can be made to operate with greater speed or can be provided with additional word lines and/or bit lines without decrease in speed.

DESCRIPTION OF THE PREFERRED EMBODIMENT

Figure 1:
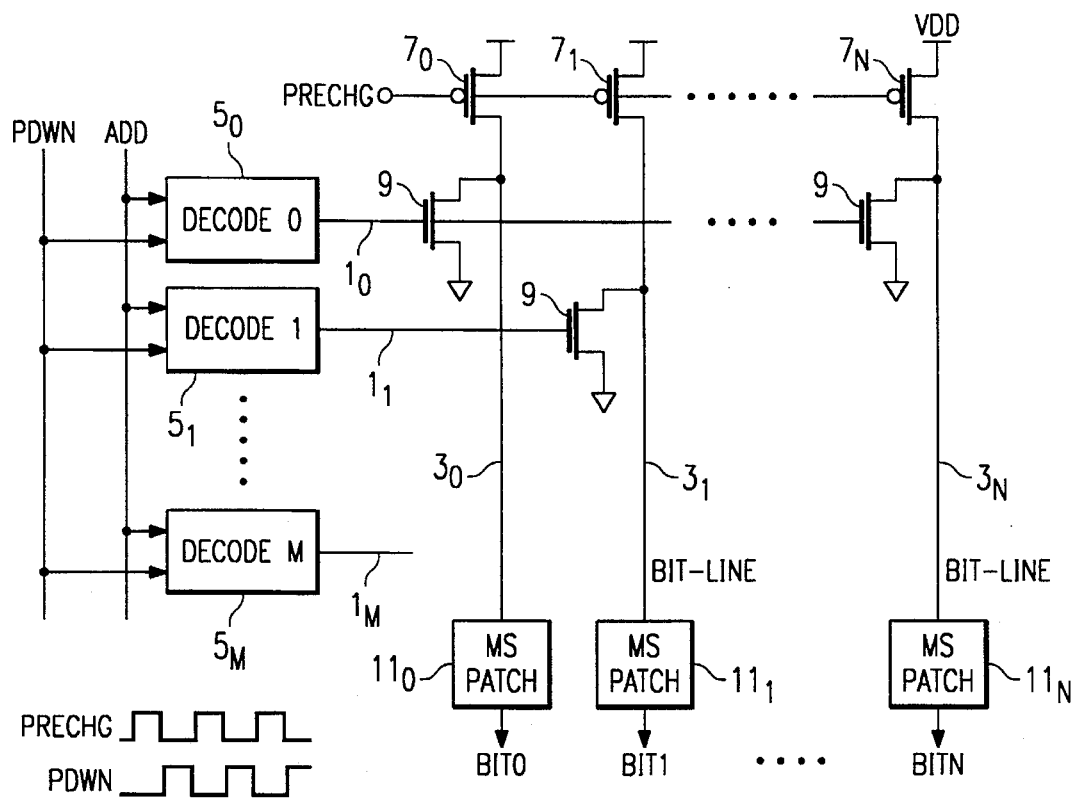
FIG. 1 is a block diagram of a typical prior art random access memory circuit.

Referring to FIG. 1, there is shown a block diagram of a typical ROM circuit. The circuit includes a plurality of row or word lines $1_0, 1_1, \ldots, 1_M$, and plurality of column or bit lines $3_0, 3_1, \ldots, 3_N$. A decode circuit $5_0, 5_1, \ldots, 5_M$ is coupled into each of the word lines to select that word line when the address for that line has been recognized by the decode circuit. Each decode circuit has an address input and a pulldown input with pulldown being low when precharge is high, the low pulldown time period preferably starting slightly before and ending slightly subsequent to the high precharge time period. The bit lines are precharged to a high voltage state with p-channel pullup devices $7_0, 7_1, \ldots 7_N$ coupled to $V_{DD}$ during the precharge phase of the master clock cycle due to a precharge signal on the gate electrodes thereof. During the other portion of the master clock cycle, which is the pulldown phase, only one address is selected by one of the decode circuits which turns on a preprogrammed word in the ROM consisting of N bits. Word programming is accomplished by placing n-channel pulldown transistors 9 for the "0" state at a bit line/word line intersection or placing nothing at the intersection for the "1" state. For the "0" state, the drain of the pulldown transistor 9 is connected to the bit line, the gate is connected to the word decode output and the source is connected to ground. Therefore, when a transistor 9 is turned on, the bit line to which it is attached goes to ground after having been previously precharged to a high voltage during the precharge phase. The state of each of the bit lines is then stored in a latch $11_0, 11_1, \ldots, 11_N$ and then read out in standard manner at the next clock cycle and the circuit is ready for the next cycle of operation.

As noted above, as the ROM size increases by increasing the number of bit lines (referred to as large word size) and/or the number of word lines (large address decode), the speed of the circuit degrades quickly due to inefficiency of the decode circuitry. This is caused by the gate capacitance on the decode line with the gate capacitance increasing as more zeros are programmed and as the number of bit lines increases, thereby inherently using more transistors to program "1"s into the ROM. Also, as the number of words increases, more transistors are required to decode the incremental change in the number of words in the ROM, thereby increasing the parasitic capacitance in the transistor chain. It is known that an increase in capacitance slows down the circuit operation. It is therefore necessary to improve the operating speed of the decode circuits $5_0, 5_1, \ldots, 5_M$.

Figure 2:
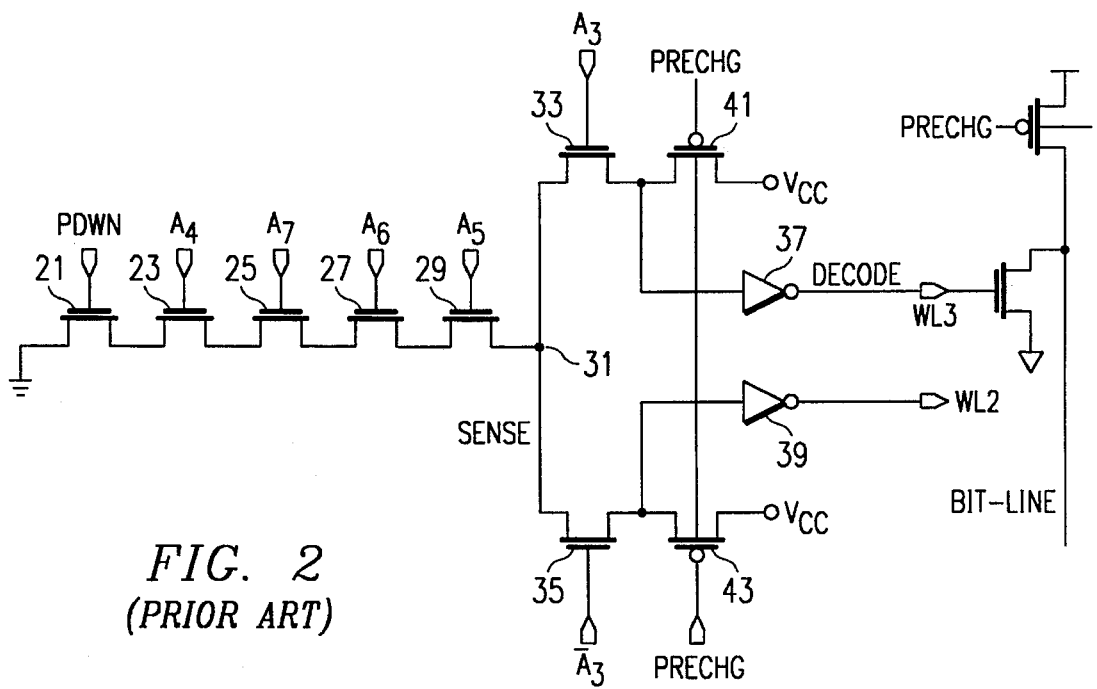
FIG. 2 is a circuit diagram of a typical prior art decode circuit which can be used in the memory circuit of FIG. 1.

Referring now to FIG. 2, there is shown a typical prior art decode circuit. The decode circuit includes a plurality of serially connected transistors of any desired number (only four address transistors and a pulldown transistors being shown) where transistor 21 is turned on by an appropriate pulldown signal and transistors 23, 25, 27 and 29 are turned on by appropriate address signals. If all of the serially connected transistors are turned on simultaneously, the node 31 will be grounded. Transistors 33 and 35 are controlled by one of an address bit and the inverse of that address bit. If node 31 is grounded and transistor 33 is on, then transistor 35 is off and the high voltage signal is provided at the decode output 37 whereas if node 31 is grounded and transistor 35 is on, transistor 33 is off and the high voltage signal is provided at the decode output 39. As stated above, transistor 33 is turned on by a predetermined address bit signal and transistor 35 is turned on by the inverse thereof.

During the precharge portion of the clock cycle, transistor 21 is off and transistors 41 and 43 are on. Therefore, when transistor 33 or 35 is on, the node 31 is precharged to a high voltage and ground potential is provided at decode outputs 37, 39. Each of the decode outputs 37, 39 corresponds to the output from one of the decode circuits $1_0, 1_1, \ldots 1_M$.

Figure 3:
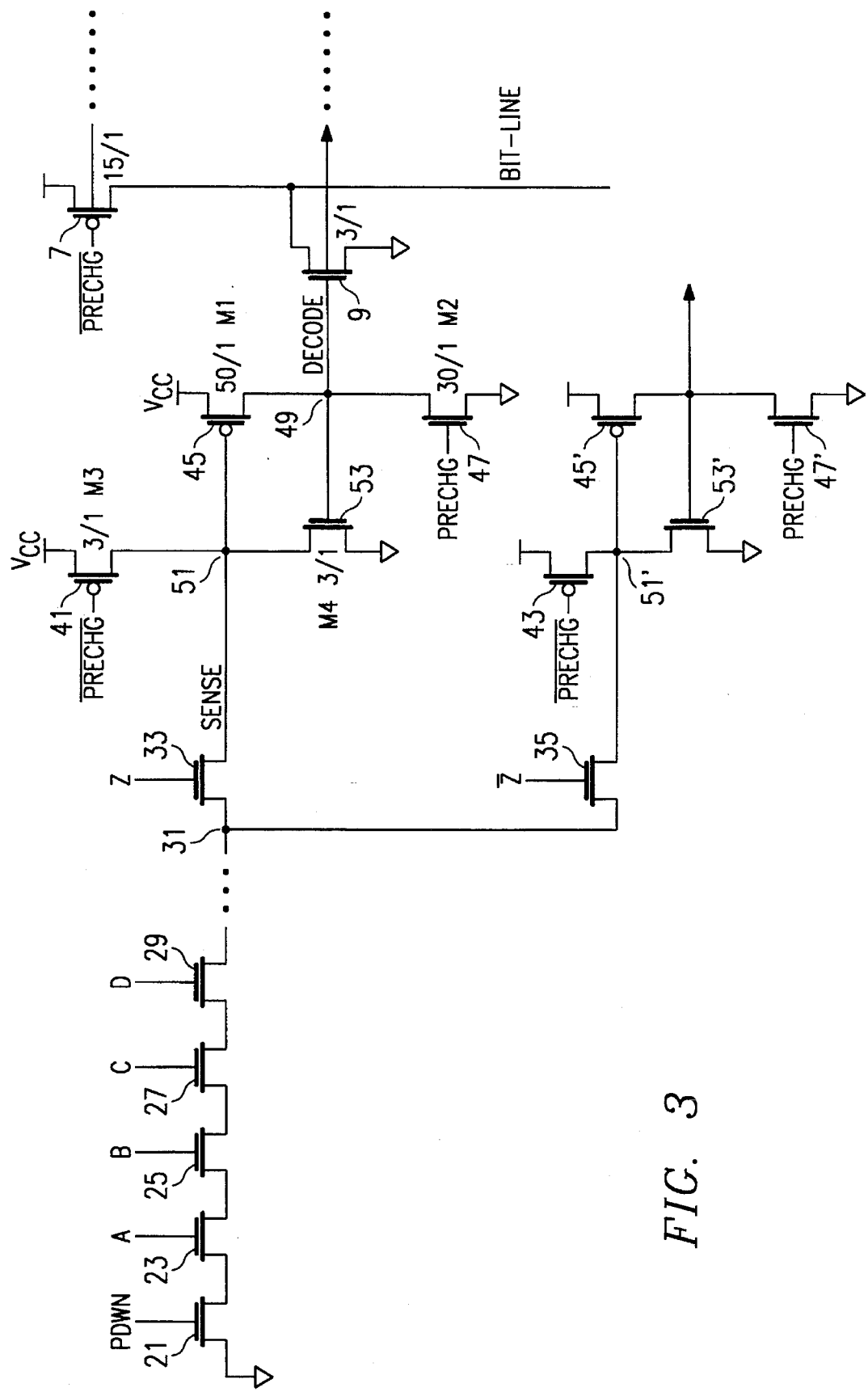
FIG. 3 is a circuit diagram of a decode circuit in accordance with the present invention.

Referring now to FIG. 3 where like number represent the same elements as in FIG. 2, there is shown a new decode circuit in accordance with the present invention which permits the use of larger address decoding and large word size (large number of bits per word) as compared with the prior art and preserves operating speed. The circuit includes a plurality of serially connected transistors where transistor 21 is turned on by an appropriate pulldown signal portion of the clock cycle and transistors 23, 25, 27 and 29 are turned on by appropriate address signals. If all of the serially connected transistors are turned on simultaneously, the node 31 will be grounded. Transistor 33 is turned on by a predetermined address bit signal and transistor 35 is turned on by the inverse thereof. During the precharge portion of the clock cycle, transistor 21 is off and transistors 41 and 43 are on. Therefore, nodes 51 and 51' are precharged to a high voltage and cause p-channel transistors 45 and 45' to turn off. Meanwhile, n-channel transistor 47 is activated by the precharge portion of the clock cycle, forcing node 49, which is the junction of serially connected transistors 45 and 47 and also an output of the decode circuit for its associated row, to be pulled low, insuring that all of the pulldown n-channel devices 9 of the preprogrammed word in that row are disabled and allowing for the precharge phase to charge the bit lines to high voltage state through transistors 7. During the second phase of the master clock (i.e, pulldown phase), transistor 21 is turned on, transistor 41 is turned off and the path from node 51 to ground is enabled through transistors 21, 23, 25, 27 and 33, causing the sense node to fall and enabling transistor 45 to charge up node 49. As the voltage on node 49 rises, the feedback n-channel device 53 is enabled, forcing node 51 to discharge to ground rapidly and consequently transistor 45 will be turned on with high current conduction. It is apparent that FIG. 3 includes an identical circuit which comes into operation in place the circuit described when transistor 35 is on and transistor 33 is off, the equivalent components of the identical circuit being depicted with identical but primed character references.

In operation, it can be seen that as the voltage on node 49 increases, transistor 53 is turned on and causes the voltage at node 51 to fall toward ground more rapidly. This more rapid drop in the voltage at node 51 causes transistor 45 to turn on more rapidly and conduct at a greater rate more rapidly, thereby raising the voltage at node 49 more rapidly. This phenomenon is known as positive feedback. It is therefore apparent that the combination of transistors 45 and 53 feed upon each other to cause more rapid increase of the voltage at decode node 49, this speed up of voltage increase compensating for any decrease in speed due to capacitive effects as discussed above. It is also apparent that the operating speed of the prior art circuit without an increase in the number of bit lines and/or word lines will increase when the circuitry of the present invention is included therein.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A decode circuit for a semiconductor memory which comprises:

(a) an address input;

(b) an output;

(c) a first transistor of a first conductivity type having a control electrode to receive a predetermined signal from said address input to provide one of a high or low voltage at said output;

(d) a second transistor of a second conductivity type opposite to said first conductivity type and responsive to the said voltage at said output to provide the other of a high or low voltage at the control electrode of said first transistor;

and a circuit to reduce the voltage at said output before said predetermined signal is received by said first transistor.

2. The circuit of claim 1 wherein said first and second transistors are MOS transistors.

3. A decode circuit for a semiconductor memory which comprises:

(a) an address input;

(b) an output;

(c) a first transistor of a first conductivity type having a control electrode to receive a predetermined signal from said address input to provide one of a high or low voltage at said output;

(d) a second transistor of a second conductivity type opposite to said first conductivity type and responsive to the said voltage at said output to provide the other of a high or low voltage at the control electrode of said first transistor;

a circuit to reduce the voltage at said output before said predetermined signal is received by said first transistor; and wherein said first transistor is a p-channel MOS transistor and said second transistor is an n-channel MOS transistor.

4. The circuit of claim 1 wherein said voltage provided at said output is a relatively high voltage and said voltage provided at said control electrode of said first transistor is a relatively low voltage.

5. The circuit of claim 2 wherein said voltage provided at said output is a relatively high voltage and said voltage provided at said control electrode of said first transistor is a relatively low voltage.

6. The circuit of claim 3 wherein said voltage provided at said output is a relatively high voltage and said voltage provided at said control electrode of said first transistor is a relatively low voltage.

7. A ROM which comprises:

(a) a plurality of bit lines;

(b) a plurality of word lines;

(c) a plurality of switches coupled to said bit lines, each said switch being associated with one of said plurality of word lines; and (d) a plurality of decode circuits, each of said decode circuits coupled to one of said plurality of word lines, each said decode circuit including:

(i) an address input;

(ii) an output for controlling said switches associated with the word line associated with said decode circuit;

(iii) a first transistor of first conductivity type having a control electrode to receive a predetermined signal from said address input to provide one of a high or low voltage at said output;

(iv) a second transistor of conductivity type opposite to said first conductivity type and responsive to the said voltage at said output to provide the other of a high or low voltage at the control electrode of said first transistor; and a circuit to reduce the voltage at said output before said predetermined signal is received by said first transistor.

8. The ROM of claim 7 wherein said first and second transistors are MOS transistors.

9. A ROM which comprises:

(a) a plurality of bit lines;

(b) a plurality of word lines;

(c) a plurality of switches coupled to said bit lines, each said switch being associated with one of said plurality of word lines; and (d) a plurality of decode circuits, each of said decode circuits coupled to one of said plurality of word lines, each said decode circuit including:

(i) an address input;

(ii) an output for controlling said switches associated with the word line associated with said decode circuit;

(iii) a first transistor of a first conductivity type having a control electrode to receive a predetermined signal from said address input to provide one of a high or low voltage at said output;

(iv) a second transistor of a conductivity type opposite to said first conductivity type and responsive to the said voltage at said output to provide the other of a high or low voltage at the control electrode of said first transistor;

a circuit to reduce the voltage at said output before said predetermined signal is received by said first transistor; and wherein said first transistor is a p-channel transistor and said second transistor is an n-channel transistor.

10. The ROM of claim 7 wherein said voltage provided at said output is a relatively high voltage and said voltage provided at said control electrode of said first transistor is a relatively low voltage.

11. The ROM of claim 8 wherein said voltage provided at said output is a relatively high voltage and said voltage provided at said control electrode of said first transistor is a relatively low voltage.

12. The ROM of claim 9 wherein said voltage provided at said output is a relatively high voltage and said voltage provided at said control electrode of said first transistor is a relatively low voltage.

* * * * *